(12) United States Patent
Seyhan et al.

(10) Patent No.: US 8,983,811 B2
(45) Date of Patent: Mar. 17, 2015

(54) SIMULATING CUSTOMER BEHAVIOR FOR DEMAND RESPONSE

(71) Applicants: Tolga Han Seyhan, Seattle, WA (US); Amit Chakraborty, East Windsor, NJ (US)

(72) Inventors: Tolga Han Seyhan, Seattle, WA (US); Amit Chakraborty, East Windsor, NJ (US)

(73) Assignee: Siemens Aktiengesellschaft, Munich (DE)

( * ) Notice: Subject to any disclaimer, the term of this patent is extended or adjusted under 35 U.S.C. 154(b) by 379 days.

(21) Appl. No.: 13/665,791

(22) Filed: Oct. 31, 2012

(65) Prior Publication Data
US 2013/0144575 A1    Jun. 6, 2013

Related U.S. Application Data

(60) Provisional application No. 61/553,364, filed on Oct. 31, 2011.

(51) Int. Cl.
| | |
|---|---|
| G06F 17/10 | (2006.01) |
| G06F 7/60 | (2006.01) |
| G06G 7/54 | (2006.01) |
| G06F 17/50 | (2006.01) |
| G06Q 30/02 | (2012.01) |
| G06Q 10/06 | (2012.01) |
| H02J 3/14 | (2006.01) |
| H02J 3/00 | (2006.01) |

(52) U.S. Cl.
CPC ........ *G06F 17/5009* (2013.01); *G06Q 30/0201* (2013.01); *H02J 2003/003* (2013.01); *H02J 2003/007* (2013.01); *G06Q 10/06* (2013.01); *H02J 3/14* (2013.01); *Y04S 10/54* (2013.01); *Y02B 70/3225* (2013.01); *Y04S 20/222* (2013.01); *Y04S 20/224* (2013.01); *Y04S 40/22* (2013.01); *Y04S 50/14* (2013.01); *Y02E 60/76* (2013.01)
USPC .................................................. 703/2; 703/18

(58) Field of Classification Search
CPC ........... G06F 17/5009; H02J 2003/003; H02J 2003/007; H02J 3/14; Y02B 70/3225; Y02E 60/76; Y04S 10/54; Y04S 20/222; Y04S 20/224; Y04S 40/22; Y04S 50/14
USPC ................................ 703/2, 18; 700/291, 295
See application file for complete search history.

(56) References Cited

U.S. PATENT DOCUMENTS

| | | | |
|---|---|---|---|
| 8,457,802 B1 * | 6/2013 | Steven et al. | 700/291 |
| 2004/0215529 A1 * | 10/2004 | Foster et al. | 705/26 |
| 2012/0065790 A1 * | 3/2012 | Boy | 700/291 |

FOREIGN PATENT DOCUMENTS

CA    2531839 A1    7/2006

OTHER PUBLICATIONS

Shaghayegh Yousefi, et al. "Optimal Real Time Pricing in an Agent-Based Retail Market Using a Comprehensive Demand Response Model". In Energy, vol. 36, No. 9, Jun. 20, 2011 (pp. 5716-5727).

(Continued)

*Primary Examiner* — Kamini S Shah
*Assistant Examiner* — Andre Pierre Louis

(57) ABSTRACT

Methods are disclosed that teach two simulators used with demand response management systems. The first simulator generates load patterns from historical customer consumption data and generates customer loads from the generated load patterns. The second simulator generates customer response to changing electricity prices using an econometric characterization of the customer response.

5 Claims, 11 Drawing Sheets

(56) References Cited

OTHER PUBLICATIONS

L. Effler, et al. "Optimization of Energy Procurement and Load Management". In IEEE Transactions on Power Systems, vol. 7, No. 1, Feb. 1, 1992 (pp. 327-333).

Rui Bo, et al. "Probabilistic LMP Forecasting Considering Load Uncertainty". In IEEE Transactions on Power Systems, vol. 24, No. 3, Aug. 2009 (pp. 1279-1289).

International Search Report dated May 27, 2013.

* cited by examiner

SIMULATING CUSTOMER BEHAVIOR FOR DEMAND RESPONSE

CROSS REFERENCE TO RELATED APPLICATIONS

This application claims the benefit of U.S. Provisional Application No. 61/553,364, filed on Oct. 31, 2011, the disclosure which is incorporated herein by reference in its entirety.

BACKGROUND OF THE INVENTION

The invention relates generally to Demand Response. More specifically, the invention relates to a method that generates load patterns from historical customer consumption data, and generates customer loads from the generated load patterns and price responses from given economic parameters.

Demand Response (DR) has become an important topic in recent years. Soaring fuel prices coupled with the environmental need to reduce fuel consumption has directed the players in the electricity sector to search for new ways to manage the generation, transmission and distribution process more efficiently. With the introduction of smart power metering systems to a mass number of customers, real-time monitoring of customer loads is made possible.

In order to employ DR mechanisms, methods such as machine learning algorithms are needed to interpret results. Yet, these methods require real world data to be calibrated, which is not readily available. Moreover, obtaining such data requires serious investment, pilot DR studies and in-depth econometric analyses.

What is desired is a method to effectively and efficiently interpret customer response and manage it, so that the overall process from electricity generation to consumption is more desirable for both the utility companies and the consumers. The utilities benefit as they can avoid costly levels of peak electrical load, while consumers enjoy lowered bills as a result of their participation.

SUMMARY OF THE INVENTION

The inventors have discovered that it would be desirable to provide simulation methods that generate load patterns from historical customer consumption data, and generate customer loads from the generated load patterns and price responses from given economic parameters. The historical customer consumption data and price responses are exogenous variables that are provided to the simulator. The historical customer consumption data may be a sample of real world customer load curves which are typically the power consumption of a customer throughout a day, and tend to change depending on if the day is a weekday, or on a weekend. Embodiments use a two-step method that first simulates the power demand of a customer over a time period, and second, generates resulting load levels. Embodiments offer a realistic substitute for a real world system.

Embodiments fulfill this need for data during the development stages of such methods. A second benefit is policy evaluation. Embodiments may be used to assess the results of DR policies before they are tested in the real world. It provides valuable data which can be used to develop better pricing strategies for utilities.

One aspect of the invention provides a customer electrical load curve simulation that uses historical customer load patterns to generate customer load curves. Methods according to this aspect of the invention include inputting pattern parameters $\hat{\mu}_0$, $\hat{\sigma}_0$, $\hat{\mu}=[\hat{\mu}_{0+\Delta t}, \ldots \hat{\mu}_{24}]$ and $\hat{\sigma}=[\hat{\sigma}_{0+\Delta t}, \ldots \hat{\sigma}_{24}]$, and simulation parameters $P_{\tilde{t}_{start}}$, $n_{sim}$ and $[\tilde{t}_{start}, \tilde{t}_{end}, \Delta \tilde{t}]$ wherein $P_{\tilde{t}_{start}}$ is the desired starting load level, $n_{sim}$ is the number of simulated load curves that will be generated, $\tilde{t}_{start}$ is the desired starting time of the simulation, $\tilde{t}_{end}$ is the desired ending time of the simulation and $\Delta \tilde{t}$ is the desired time resolution for the simulation, $\hat{\mu}_0$ and $\hat{\sigma}_0$ are the mean and standard deviation of the starting load level of estimated pattern parameters and $\hat{\mu}$ and $\hat{\sigma}$ are vectors which represent the mean and the standard deviation of the load changes between each load sample $\Delta t$, determining a scaling parameter $\alpha = P_{\tilde{t}_{start}} / \mu_{\tilde{t}_{start}}$, where $\mu_{\tilde{t}_{start}}$ is a desired starting time, and multiplying the mean $\hat{\mu}$ and variance a $\hat{\sigma}$ parameters by the scaling parameter $\alpha$, generating random numbers that are distributed according to a standard noinial distribution, wherein generating $u_{\tilde{t}}$ that are uniformly distributed in $[0,1]$ and converting the $u_{\tilde{t}}$ to standard normal random numbers by inverse transform sampling $\Phi^{-1}(u)$, calculating the load $P_{j,\tilde{t}} = P_{j,\tilde{t}-\Delta \tilde{t}} + \mu_{\tilde{t}} + \Phi^{-1}(u_{\tilde{t}}) \sigma_{\tilde{t}}$ for each simulation replication $j \in \{1, \ldots, n_{sim}\}$ and time point $\tilde{t} \in [\tilde{t}_{start}, \tilde{t}_{end}]$, and calculating a load matrix $$P = [P_{j,\tilde{t}}] \in R^{n_{sim} \times \left(\frac{\tilde{t}_{end} - \tilde{t}_{start}}{\Delta \tilde{t}} + 1\right)}$$

as output.

Another aspect of the invention provides a method that calculates pattern parameter data from historical customer load data. Methods according to this aspect of the invention include inputting historical electrical load data $\hat{P}_{ti}$ for each time interval $t \in [0,24]$ and observation $i=1, 2, \ldots, N$, calculating the mean $\hat{\mu}_0 = \Sigma_{i=1}^{N} \hat{P}_{0i}/N$ and the standard deviation $\hat{\sigma}_0 = \sqrt{\Sigma_{i=1}^{N}(\hat{P}_{0i}-\hat{\mu}_0)^2/(N-1)}$ of starting load level $P_0$, and calculating the mean $\hat{\mu}_t = \Sigma_{i=1}^{N} \Delta \hat{P}_{ti}/N$ and the standard deviation $\hat{\sigma}_t = \sqrt{\Sigma_{i=1}^{N}(\Delta \hat{P}_{ti}-\hat{\mu}_t)^2/(N-1)}$ of the load change $\Delta P_t$ between time $t-\Delta t$ and $t$.

Another aspect of the invention provides a customer response simulation that divides customer electrical demand into categories with different price elasticities and then aggregates the results once a price change occurs to simulate the customer's response to the changing electricity price. Methods according to this aspect of the invention include inputting parameters $P_0$, $r_0$, $r$, $v$, $\epsilon$, $s$ and $f_{type}$ wherein $P_0$ is the corresponding electrical load level, $r_0$ is the current price of electricity, $r$ is the proposed price of electricity, the vector $v=[v_1, \ldots, v_n]$ shows the proportion of each end use of electricity within the current consumption for each end use $k=1, \ldots, n$, the vector $\epsilon=[\epsilon_1, \ldots \epsilon_n]$ represents the price elasticity of each end use, the vector $s=[s_1, \ldots, s_n]$ which is the coefficient of variation, the ratio of the standard deviation of the response to the mean load level and $f_{type}$ is the type of the function that is used in the characterization of the customer's response, examining the function type $f_{type}$ comprising if the function type $f_{type}$ is constant elasticity, calculating the customer's expected load level for end use k as $$P_k = P_0 v_k \left(\frac{r}{r_0}\right)^{\epsilon_k}$$

where $P_0 v_k$ is the customer's current power consumption for end use k, and if the function type $f_{type}$ is linear, estimating the demand curve by calculating the slope $m_k$ of the individual demand curve of each end use k at the current price $r_0$ and load level $P_0$ as $$m_k = \frac{r_0}{P_0 v_k \epsilon_k},$$

and calculating the customer's expected load level for each end use k as $$P_k = \max\left\{0, P_0 v_k + \frac{r - r_0}{m_k}\right\}$$

wherein the load cannot be negative, and generating random numbers that are distributed according to a standard normal distribution, wherein generating $u_k$ that are uniformly distributed in [0,1] and converting the $u_k$ to standard normal random numbers by inverse transform sampling $\Phi^{-1}(u_k)$, generating the customer's load level (consumption) for end use k, which is a random number that is normally distributed with mean $P_k$ and standard deviation $P_k s_k$, and calculating the customer's final load level which is the sum of the load levels of each individual end use as $P = \Sigma_{k=1}^n P_k + \Phi^{-1}(u_k) P_k s_k$.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
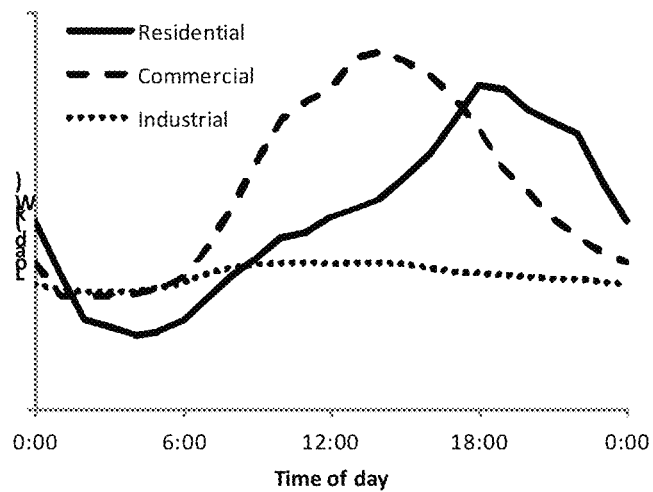
FIG. 1 is a plot of exemplary load curves that compare load to customer type.

Embodiments of the invention will be described with reference to the accompanying drawing figures wherein like numbers represent like elements throughout. Before embodiments of the invention are explained in detail, it is to be understood that the invention is not limited in its application to the details of the examples set forth in the following description or illustrated in the figures. The invention is capable of other embodiments and of being practiced or carried out in a variety of applications and in various ways. Also, it is to be understood that the phraseology and terminology used herein is for the purpose of description and should not be regarded as limiting. The use of "including," "comprising," or "having," and variations thereof herein is meant to encompass the items listed thereafter and equivalents thereof as well as additional items.

The terms "connected" and "coupled" are used broadly and encompass both direct and indirect connecting, and coupling. Further, "connected" and "coupled" are not restricted to physical or mechanical connections or couplings.

It should be noted that the invention is not limited to any particular software language described or that is implied in the figures. One of ordinary skill in the art will understand that a variety of alternative software languages may be used for implementation of the invention. It should also be understood that some of the components and items are illustrated and described as if they were hardware elements, as is common practice within the art. However, one of ordinary skill in the art, and based on a reading of this detailed description, would understand that, in at least one embodiment, components in the method and system may be implemented in software or hardware.

Embodiments of the invention provide methods, system frameworks, and a computer-usable medium storing computer-readable instructions that provide two simulators to be used with Demand Response (DR) management systems. The first simulator generates customer load patterns from observed, historical customer consumption load data, and then uses the generated load patterns to generate customer load curves. The second simulator uses an econometric characterization of customer response to changing electricity prices. It uses the customer load curves output from the first simulator in conjunction with current electricity prices to generate a customer response for proposed electricity prices. Aspects of the methods may be distributed and executed at and on a plurality of computing devices. For example, a PC, a Mac, a tablet computer, a laptop computer, etc., each employing a mouse, touchpad or touchscreen as a pointing device and I/O for data input and exchange. Embodiments may be deployed as software as an application program tangibly embodied on a non-transitory computer readable program storage device. The application code for execution can reside on a plurality of different types of computer readable media known to those skilled in the art.

Embodiments provide input to other methods that study DR mechanisms where real data is not available. Moreover, they provide policy evaluation where one can test potential contract parameters and iteratively improve the contract.

Figure 2:
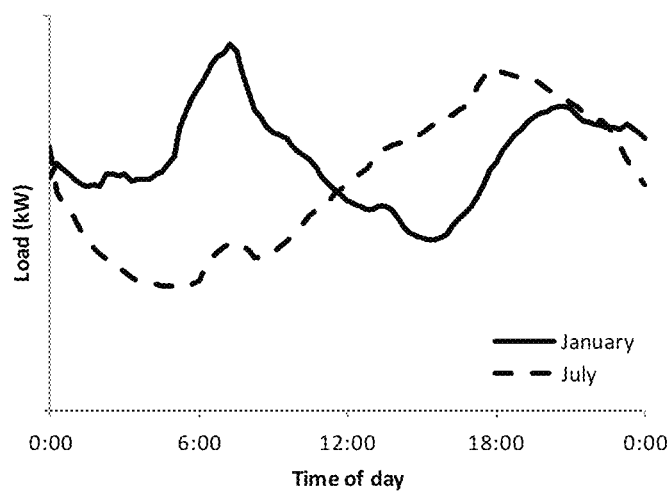
FIG. 2 is a plot of exemplary load curves that compare load to time of year.
Figure 3:
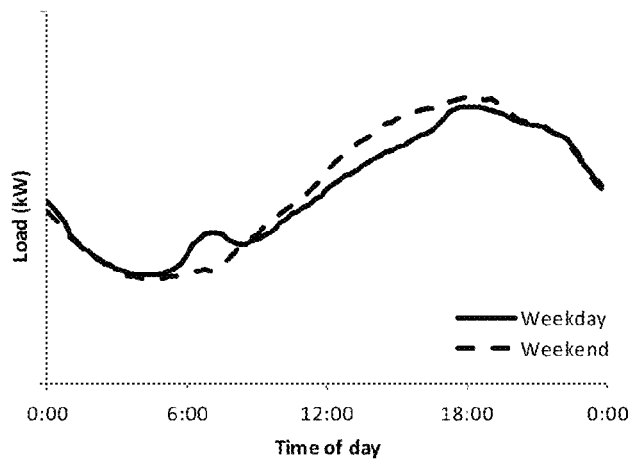
FIG. 3 is a plot of exemplary load curves that compare load to day of the week.

Embodiments simulate the electricity load curve of a given customer over a period of time. The load curve reflects the customer's power consumption within the day and has a distinctive shape depending on customer type (commercial, residential, industrial, etc.) (FIG. 1), time of year, which is a proxy for seasonal weather (spring, summer, fall and winter) (FIG. 2) and day type (weekday, weekend) (FIG. 3). Embodiments use these parameters to generate separate load patterns for each customer type, time of year and day type. For the simulation results to be representative, the shape of the generated load patterns should match the distinctive shape of the target tuple—customer type, time of year and day of week.

Electrical load is time dependent, as a result of human activity that varies within the day. Embodiments treat load changes within a day as a time series, without relating them to any underlying cause other than those already isolated above before generating the load patterns. To closely represent the daily movement, historical customer load data with a fine time resolution is needed in order not to lose important information such as peak load and time. Fine time intervals may be made coarser, but the converse is not true.

Embodiments use historical customer load data segregated into customer type (commercial, residential and industrial) and sampled in a fine time resolution (e.g., every hour) for proper identification of load patterns.

Figure 4:
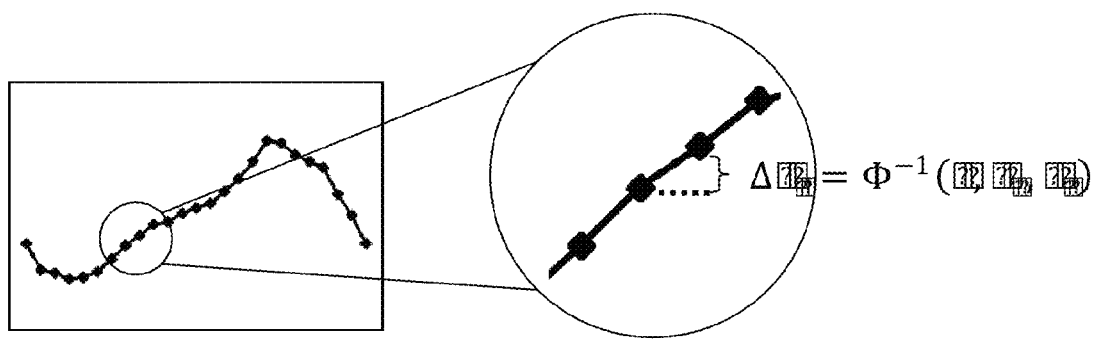
FIG. 4 shows an exemplary curve that illustrates a Gaussian random walk.
Figure 5:
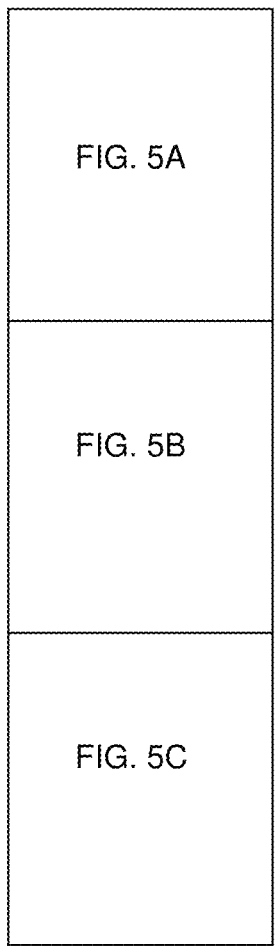
FIGS. 5, 5A, 5B and 5C are an exemplary customer load curve simulation method.
Figure 5A:
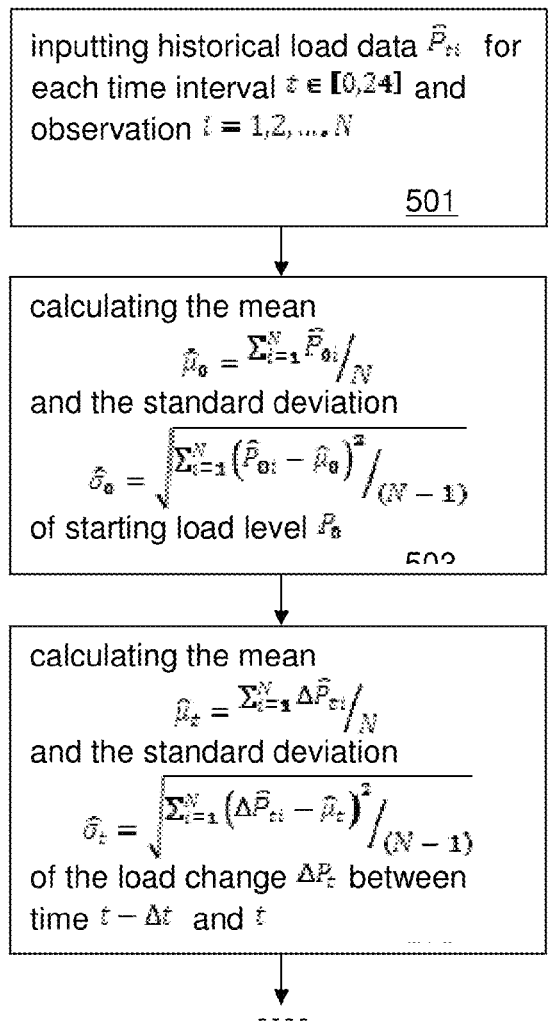
Figure 5B:
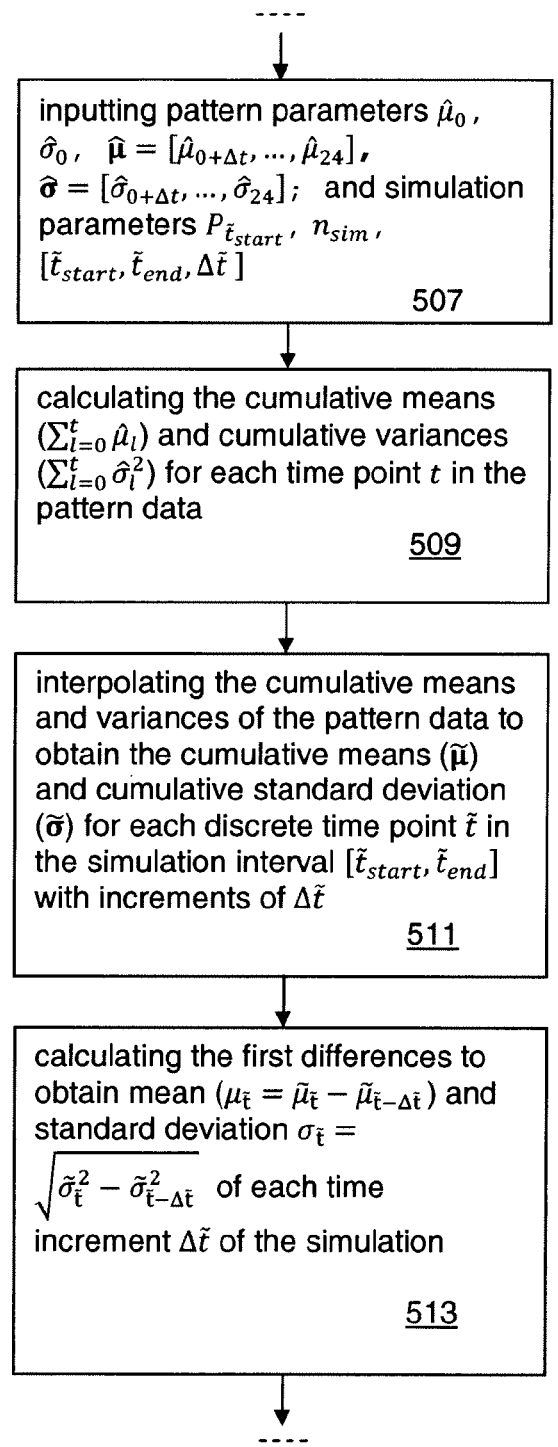
Figure 5C:
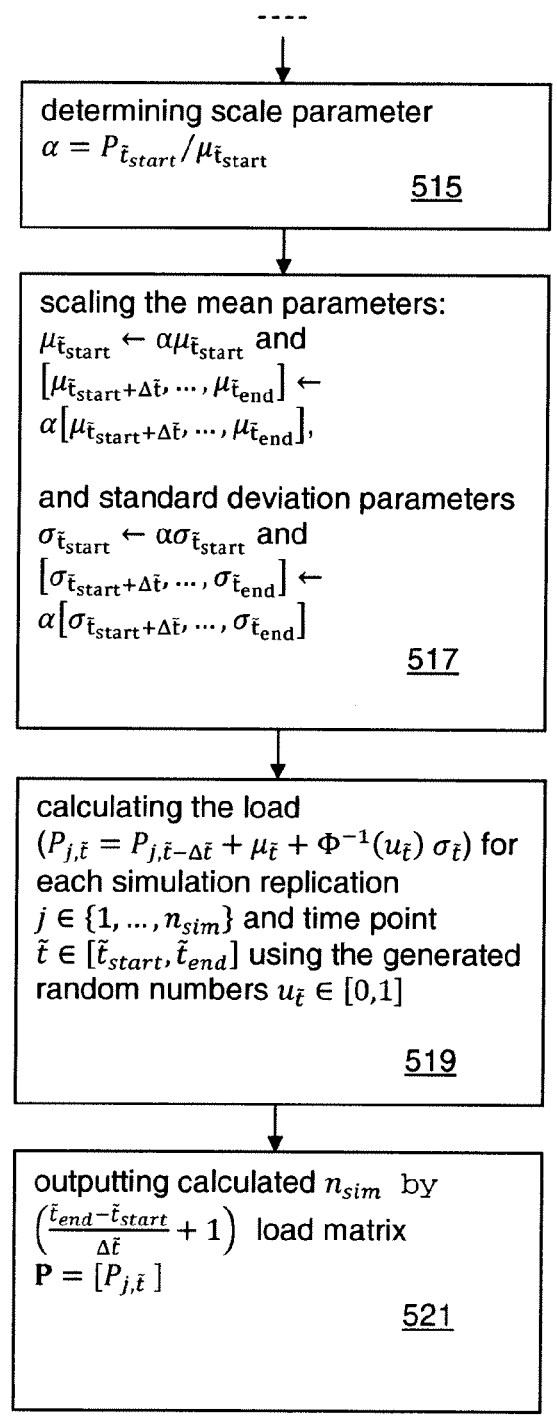

Embodiments use a Gaussian random walk to simulate customer load curves. FIG. 4 shows a Gaussian random walk.

The change in load in each time step is presumed to be an independently distributed normal random variable, such that the change in load level is $$P_t - P_{t-\Delta t} = \Delta P_t = \mu_t + \sigma_t \Phi^{-1}(u_t) \quad (1)$$

where $P_t$ is the load in kW at a time $t \in [0,24]$ hours and refers to the simulated value during simulation, $\mu_t$ is the mean and $\sigma_t$ is the standard deviation of the load change from $t-\Delta t$ to $t$, where $\Delta t$ is the time resolution. $\Phi^{-1}(u_t)$ is the inverse cumulative distribution function of a standard normal distribution for probability $u_t \in [0,1]$. $\mu_0$ is defined as the mean and $\sigma_b$ is defined as the standard deviation of the load at time $t=0$ (i.e., the starting load level $P_0$). Note that, $\Phi^{-1}(u_t)$ is a random variable that is distributed with a standard noLmal distribution for a given $u_t$. During the simulation, $u_t$ is randomly generated. Therefore, the right hand size of (1) will convert a standard normal random variable to a normal random variable that is distributed with mean $\mu_t$ and standard deviation $\sigma_t$.

FIGS. 5, 5A, 5B and 5C show the customer load curve simulation method. Customer load pattern parameters are calculated from observed, historical customer load data, which are then used to generate customer load curves. Once calculated, the customer load pattern parameters can be stored in memory and used in future simulations directly without recalculation.

Customer load pattern parameters are calculated from historical load data of a given group of customers. The load data comprises observations of daily load (e.g., through 30 days) at a desired sampling frequency (e.g., every 15 minutes). The historical load data may be acquired using, for example, smart electricity meters measuring power (e.g., kW) and energy (e.g., kWh), and stored in memory for input to a network or computer.

The historical load data and generated load pattern parameters (data) are denoted using "a hat" over the unit vector variables. $\hat{P}_{ti}$ is historical load data obtained at time $t$ in observation $i$, where $i=1, 2, \ldots, N$, with $N$ the number of load level observations (step 501).

After historical load data acquisition, load pattern parameters are generated. The starting load level $P_0$ has a mean $\hat{\mu}_0 = \Sigma_{i=1}^{N} \hat{P}_{0i}/N$ and a standard deviation $\hat{\sigma}_0 = \sqrt{\Sigma_{i=1}^{N}(\hat{P}_{0i}-\hat{\mu}_0)^2/(N-1)}$ (step 503). Similarly, the load change $\Delta P_t$ from time $t-\Delta t$ to time $t$ has a mean $\hat{\mu}_t = \Sigma_{i=1}^{N} \Delta \hat{P}_{ti}/N$ and a standard deviation $\hat{\sigma}_t = \sqrt{\Sigma_{i=1}^{N}(\Delta \hat{P}_{ti}-\hat{\mu}_t)^2/(N-1)}$. $\hat{\mu}_t$ and $\hat{\sigma}_t$ are calculated for each $t=\Delta t, 2\Delta t, \ldots, 24$ and are represented, respectively, as vectors $\hat{\mu}=[\hat{\mu}_{0+\Delta t}, \ldots \hat{\mu}_{24}]$ and $\hat{\sigma}=[\hat{\sigma}_{0+\Delta t}, \ldots \hat{\sigma}_{24}]$ (step 505).

Load pattern parameters $\hat{\mu}_0$ and $\hat{\sigma}_0$, vectors $\hat{\mu}=[\hat{\mu}_{0+\Delta t}, \ldots \hat{\mu}_{24}]$ and $\hat{\sigma}=[\hat{\sigma}_{0+\Delta t}, \ldots \hat{\sigma}_{24}]$ from $\hat{\mu}_t$ and $\hat{\sigma}_t$, and simulation parameters $P_{\tilde{t}_{start}}$, $n_{sim}$ and $[\tilde{t}_{start}, \tilde{t}_{end}, \Delta \tilde{t}]$ are input (step 507).

$P_{\tilde{t}_{start}}$ is the desired starting load level (e.g., Watts), $n_{sim}$ is the number of simulated load curves that will be generated, $\tilde{t}_{start}$ is the desired starting time of the simulation (typical default is 0), $\tilde{t}_{end}$ is the desired ending time of the simulation (typical default is 24) and $\Delta \tilde{t}$ at is the desired time resolution for the simulation (typical default is 15 minutes).

The method presumes that future electrical load follows the pattern parameters with appropriate scaling of the calculated parameters and randomness of the calculated mean values. $\hat{\mu}_0$ and $\hat{\sigma}_0$ are the mean and standard deviation of the starting load level of the pattern parameter data and $\hat{\mu}$ and $\hat{\sigma}$ are vectors which represent the mean and the standard deviation of the load changes between each time period $\Delta t$ of the pattern parameter data. $\tilde{t}_{start}$ and $\tilde{t}_{end}$ may be different from the pattern parameter data. For example, the pattern parameters can be estimated using daily data between hours 0 and 24, but the patterns and the load levels that are generated using them will be needed the most for the peak period between 12 PM to 4 PM.

The time frame (default is [0,24]) and time resolution $\Delta t$ of the pattern parameter data may be converted to a desired time frame $[\tilde{t}_{start}, \tilde{t}_{end}]$ and time resolution $\Delta \tilde{t}$ (steps 509, 511, 513). This operation is optional and is used if the time frame and/or time resolution of the historical load data (and therefore the pattern parameter data) is different from the desired time frame $[\tilde{t}_{start}, \tilde{t}_{end}]$ and time resolution $\Delta \tilde{t}$. For example, if the pattern parameter data was sampled every 15 minutes in a 24 hour period, but the desired time resolution for the simulation will be every 10 minutes between 12 PM to 4 PM, the pattern parameter time resolution must be converted to the desired time resolution. Using the existing pattern parameter data, a starting load at hour 12 PM is found and 10 minute samples for the desired time resolution are calculated using interpolation. Cumulative means $\Sigma_{i=0}^{t} \hat{\mu}_i$ and variances $\Sigma_{i=0}^{t} \hat{\sigma}_i^2$ are found for each time point $t$ in the pattern parameter data (step 509). Note that variance is the square of the standard deviation by definition.

The cumulative means $\Sigma_{i=0}^{\tilde{t}} \hat{\mu}_i, \Sigma_{i=0}^{\tilde{t}} \hat{\sigma}_i^2$ of the pattern parameter data are interpolated to obtain the cumulative means $\tilde{\mu}$ and the cumulative standard deviation $\tilde{\sigma}$ vectors for each discrete time point $\tilde{t}$ value in the simulation interval $\tilde{t} \in [\tilde{t}_{start}, \tilde{t}_{end}]$ with increments of $\Delta \tilde{t}$ (step 511).

For example, the mean of the starting load level at the beginning of the ($\tilde{t}_{start}$) is interpolated as $\tilde{\mu}_{\tilde{t}_{start}} = \Sigma_{i=0}^{t_1} \hat{\mu}_i + \hat{\mu}_{t_2} (\tilde{t}_{start}-t_1)/(t_2-t_1)$, where $t_1$ is the closest time point in the pattern parameter data that is smaller than $\tilde{t}_{start}$ and $t_2$ is the closest time point in the pattern parameter data that is larger than $\tilde{t}_{start}$. In other words, $t_1 \leq \tilde{t}_{start} \leq t_2$ and $t_2 = t_1 + \Delta t$. The standard deviation of the starting load level is similarly found as $\tilde{\sigma}_{\tilde{t}_{start}} = \sqrt{\Sigma_{i=0}^{t_1} \hat{\sigma}_i^2 + \hat{\sigma}_{t_2}(\tilde{t}_{start}-t_1)/(t_2-t_1)}$. The same method is used to calculate each $\tilde{t}$ in $[\tilde{t}_{start}, \tilde{t}_{end}]$ with increments $\Delta \tilde{t}$.

First differences are calculated to obtain the means $\tilde{\mu}_{\tilde{t}} = \tilde{\mu}_{\tilde{t}} - \tilde{\mu}_{\tilde{t}-\Delta \tilde{t}}$ and standard deviations $\tilde{\sigma}_{\tilde{t}} = \sqrt{\tilde{\sigma}_{\tilde{t}}^2 - \tilde{\sigma}_{\tilde{t}-\Delta \tilde{t}}^2}$ for each time increment $\Delta \tilde{t}$ of the simulation starting from $\tilde{t} = \tilde{t}_{start} + \Delta \tilde{t}$ to $\tilde{t}_{end}$ (step 513). Therefore, the conversion from the pattern parameter data's time resolution $\Delta t$ to the desired time resolution $\Delta \tilde{t}$ is complete, yielding the mean of the starting load level $\tilde{\mu}_{\tilde{t}_{start}}$, standard deviation of the starting load level $\tilde{\sigma}_{\tilde{t}_{start}}$ and vectors denoting the means of the increments $[\tilde{\mu}_{\tilde{t}_{start}+\Delta \tilde{t}}, \ldots, \tilde{\mu}_{\tilde{t}_{end}}]$ and the standard deviation of the increments $[\tilde{\sigma}_{\tilde{t}_{start}+\Delta \tilde{t}}, \ldots, \tilde{\sigma}_{\tilde{t}_{end}}]$.

If $P_{\tilde{t}_{start}} \neq \tilde{\mu}_{\tilde{t}_{start}}$, the pattern parameter data are scaled using scaling factor $\alpha = P_{\tilde{t}_{start}}/\tilde{\mu}_{\tilde{t}_{start}}$ (step 515). This is performed in order to properly scale the parameters of the pattern and to the load levels that are to be simulated. For example, the pattern parameters may be calculated from a group of residential units that start the day, on average, with a load of 100 kW, but a desired simulation may be for a larger group which has an average starting load of 500 kW. In this case, a scaling parameter of α=5 is used. The mean $\mu_{\tilde{t}}$ and standard deviation $\sigma_{\tilde{t}}$ parameters found during conversion (step 513) are multiplied by the scaling parameter α (step 517). This yields scaled parameters $\mu_{\tilde{t}_{start}}$ and $\sigma_{\tilde{t}_{start}}$ for the starting load level, and vectors $[\mu_{\tilde{t}_{start+\Delta\tilde{t}}}, \ldots, \mu_{\tilde{t}_{end}}]$ and $[\sigma_{\tilde{t}_{start+\Delta\tilde{t}}}, \ldots, \sigma_{\tilde{t}_{end}}]$ showing parameters for each time increment.

Random numbers $u_{\tilde{t}}$ that are uniformly distributed in [0,1] are generated. They are converted to standard normal random numbers by inverse transform sampling $\Phi^{-1}(u_{\tilde{t}})$. This is the common way of generating random numbers that follow a standard normal distribution and are therefore not shown as an independent step in the method.

A load $P_{j,\tilde{t}} = P_{j,\tilde{t}-\Delta\tilde{t}} + \mu_{\tilde{t}} + \Phi^{-1}(u_{\tilde{t}})\sigma_{\tilde{t}}$ is calculated for each simulation replication $j \in \{1, \ldots, n_{sim}\}$ and time point $\tilde{t} \in [\tilde{t}_{start}, \tilde{t}_{end}]$ (step 519). This yields an $n_{sim}$ by $$\left(\frac{\tilde{t}_{end} - \tilde{t}_{start}}{\Delta \tilde{t}} + 1\right)$$

load matrix P with entries for each $(j,\tilde{t})$ pair. Finally, $$P = [P_{j,\tilde{t}}] \quad (2)$$

is output (step 521).

Figure 6:
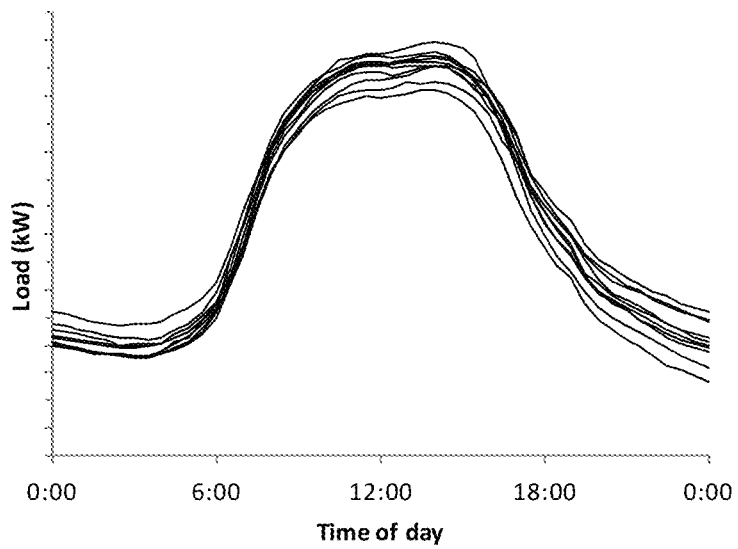
FIG. 6 is a plot of load simulation curves that compare load to the time of the day.

FIG. 6 shows an example load matrix P output, which depicts 10 weekday replications for a commercial customer in July. There is a load matrix P for each time point $\tilde{t}$ and replication j of the simulation.

The customer load curve simulation method has two advantages: 1) the calculated means ($\mu_{\tilde{t}_{start}}, [\mu_{\tilde{t}_{start+\Delta\tilde{t}}}, \ldots, \mu_{\tilde{t}_{end}}]$) and standard deviations ($\sigma_{\tilde{t}_{start}}, [\sigma_{\tilde{t}_{start+\Delta\tilde{t}}}, \ldots, \sigma_{\tilde{t}_{end}}]$) represent the average shape of the load curve and the variation around it and 2) the Gaussian random walk provides smooth load transitions between time steps.

Figure 7:
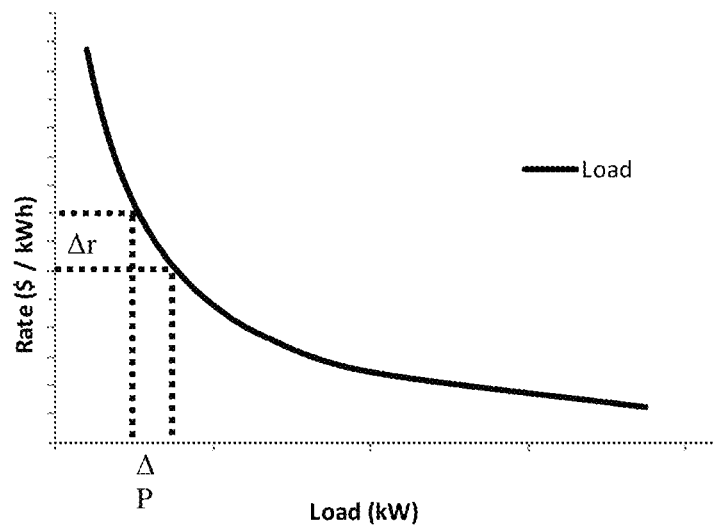
FIG. 7 is a plot of an exemplary load curve that compares load to the price of electricity (rate).

A customer's response to changes in the price of electricity is represented using the concept of price elasticity of demand. Elasticity is the measure of responsiveness in economics. The price elasticity $\epsilon$ of a customer's power demand is defined as $$\epsilon = \frac{\Delta P}{P} \bigg/ \frac{\Delta r}{r}, \quad (3)$$

where P is the load and r is the contracted rate (i.e., the price of electricity). FIG. 7 shows an elasticity plot. The quantity shows the percentage of load change with respect to a one percent change in price. Since this measure uses ratios rather than quantities, it is dimensionless (free of units).

Figure 8:
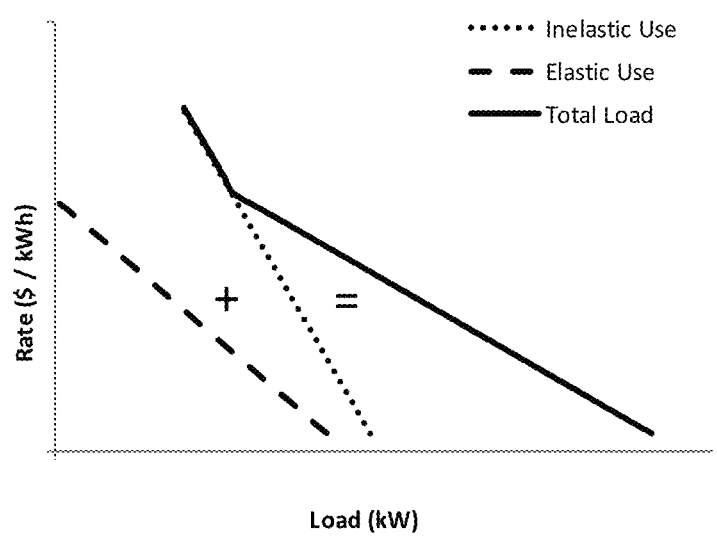
FIG. 8 is a plot showing an exemplary aggregation of demand.

An important aspect of the customer load is that not all end uses of the electricity have the same responsiveness. For example, a consumer might use air conditioning less if the price is high, but not turn the refrigerator off. In this example, electricity consumption for air conditioning is more sensitive to price changes (i.e., elastic) than the electricity consumption for the refrigerator. In order to reflect this aspect, embodiments divide customer demand into categories with different price elasticities, and then aggregate the results from them once a price change occurs. From this point of view, this approach is similar to obtaining the aggregate demand curve from the demand curves of individuals. FIG. 8 shows an aggregation of demand.

Note that price elasticity in the above setting refers to load shedding but not rescheduling of the consumption. Embodiments presume that the consumer uses less if the price of electricity increases, but not postpone the consumption to a later time in the day. For instance, a consumer may postpone using a washing machine to the evening, when the price of electricity is lower. On the contrary, it is not true for AC. This may be handled using the similar concept of cross price elasticity, in which percentage change in the consumption of one product is calculated against one percent change in the price of another product. Then, the electricity consumed at different times are considered as different products, even if they are used for the same reason.

Embodiments need to obtain an empirical demand curve and estimate the price elasticities. However, there is not enough reliable data for this. Embodiments use the concept with reasonably set parameters.

Figure 9:
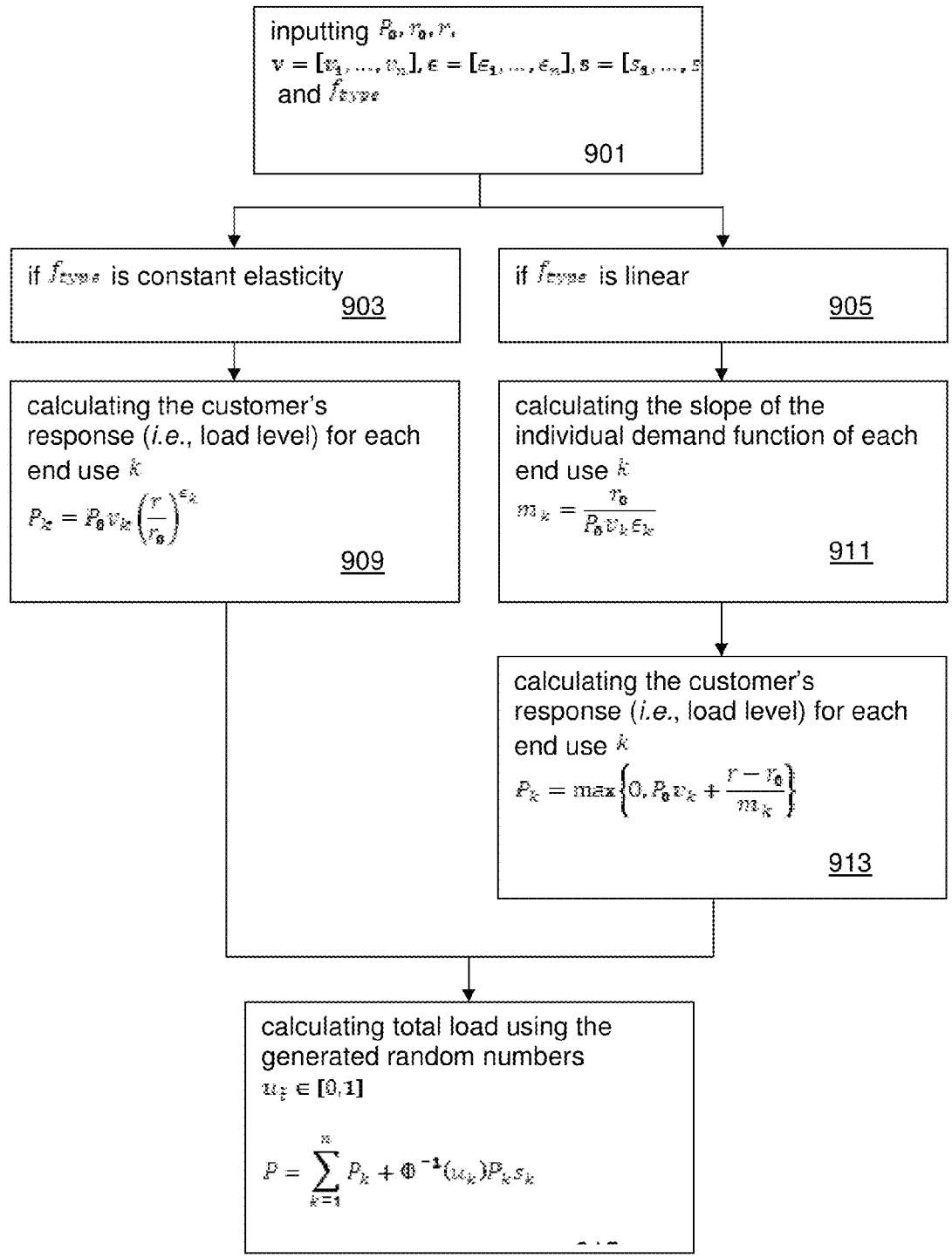
FIG. 9 is an exemplary customer response to changing electricity price simulation method.

FIG. 9 shows the method for simulating customer response to changing electricity prices. The method requires inputs $P_0$, $r_0$, r, v, $\epsilon$, $f_{type}$ and s (step 901). $P_0$ is the corresponding load level, rb is the current price of electricity, r is the proposed price of electricity, the vector $v=[v_1, \ldots, v_n]$ shows the proportion of each end use of electricity within the current consumption for each end use $k=1, \ldots, n$, the vector $\epsilon=[\epsilon_1, \ldots, \epsilon_n]$ represents the price elasticity of each end use, the vector $s=[s_1, \ldots, s_n]$ is the coefficient of variation which is the ratio of the standard deviation of the response to the mean load level and $f_{type}$ specifies the type of the function that is used in the characterization of the customer's response.

The data calculated by the customer load curve simulation is input. For each entry $P_{j,\tilde{t}}$ of the calculated load matrix P, the customer response simulation method is used to calculate a customer response. Note that if there is no price change, then $P_{j,\tilde{t}}$ will remain unaffected. The inputs $r_0$, r, v, $\epsilon$ also have a time dimension. For instance, there is an existing (i.e., current) electricity price for each time point $\tilde{t} \in [\tilde{t}_{start}, \tilde{t}_{end}]$. However, since the same method is going to be implemented for each $j=1, \ldots, n_{sim}$ and $\tilde{t} \in [\tilde{t}_{start}, \tilde{t}_{end}]$ those subscripts are dropped to make the notation simpler. As the price of the electricity changes from $r_0$ to r, the customer responds to the price change by altering the load level P. Electricity is consumed for different end uses. If there are n uses, then the vector $v=[v_1, \ldots, v_n]$ shows the proportion of each end use within the customer's current consumption. For example, $v_k=0.2$ means end use $k \in \{1, \ldots, n\}$ constitutes 20% percent of current consumption. Each end use has a different sensitivity to the changes in the price of electricity. Therefore, the vector $\epsilon=[\epsilon_1, \ldots, \epsilon_n]$ is the price elasticity of each end use. For example, from (3), $\epsilon_i=0.1$ means the power demand for end use k would decrease by 0.1% if the price of electricity increases by 1%.

Two types of demand functions are used to simulate customer response, a linear demand function or a constant elasticity demand function. The input parameter $f_{type}$ specifies demand function type.

Randomness is introduced to the customer's response, $s=[s_1, \ldots, s_n]$ which is the coefficient of variation, i.e., the ratio of the standard deviation of the response to the mean load level for each end use k.

Embodiments presume that the end uses are not substitutable, therefore, the cross price elasticity among end uses are discarded. From a different perspective, the same end use over two different time periods (e.g., laundry at 2 PM or 10 PM) can be considered substitutable. Then, there is cross price elasticity between these two time periods. This effect is discarded because the simulation is for emergency DR and peak period loads are considered. Postponing the consumption from a time point in the peak period to another time point which is still within the peak period is negligible. Nevertheless, extending the model to these settings is straightforward.

Embodiments output customer load P depending on whether the function type $f_{type}$ is constant elasticity (step 903) or linear (step 905).

A customer responds to a price change from $r_0$ to r, by changing $P_0v_k$, the initial load associated with each end use k. If the function type $f_{type}$ is constant elasticity, the customer's expected (i.e., mean, average) load level for end use k is calculated as $$P_k = P_0 v_k \left(\frac{r}{r_0}\right)^{\epsilon_k}$$

(step 909).

If the function type $f_{type}$ is linear, the slope ($m_k$) of the individual demand curve of each end use k at the current price $r_0$ and load level $P_0$ is estimated, $$m_k = \frac{r_0}{P_0 v_k \epsilon_k}$$

(step 911). In this manner, the linear demand function for each end use is characterized as it is sufficient to characterize a linear function with a point on the function ($P_0, r_0$) and the slope $m_k$. Then, the customer's expected load level for each end use k is calculated as $$P_k = \max\left\{0, P_0 v_k + \frac{r - r_0}{m_k}\right\}.$$

The load cannot be negative (step 913).

Randomness is introduced to customer response around the expected value. $u_k$ is a random number that is uniformly distributed in [0,1] from which the load level for end use k is generated, which is a random number that is normally distributed with mean $P_k$ and standard deviation $P_k s_k$.

The customer's final load level is the sum of the load levels of each individual end user, which is calculated as $P = \sum_{k=1}^{n} P_k + \Phi^{-1}(u_k) P_k s_k$ (step 915).

Figure 10:
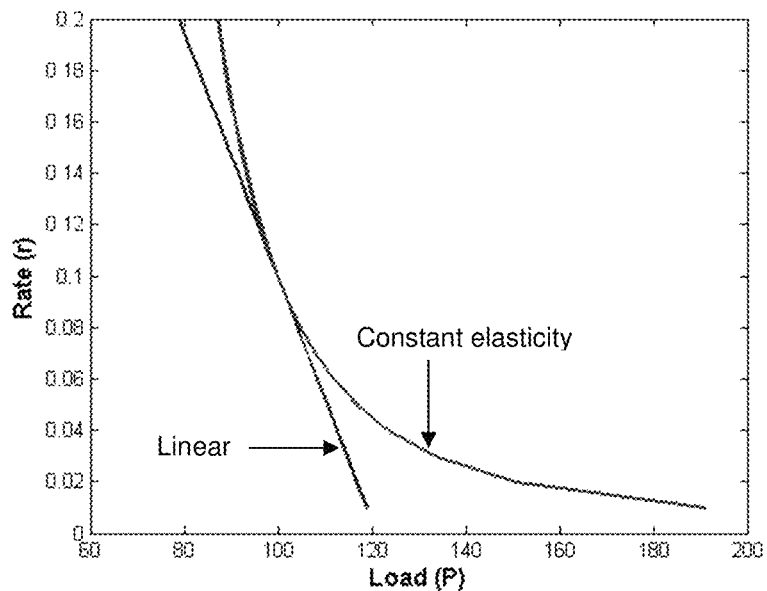
FIG. 10 is a plot showing exemplary linear and constant elasticity comparisons of load to the price of electricity (rate).
Figure 11:
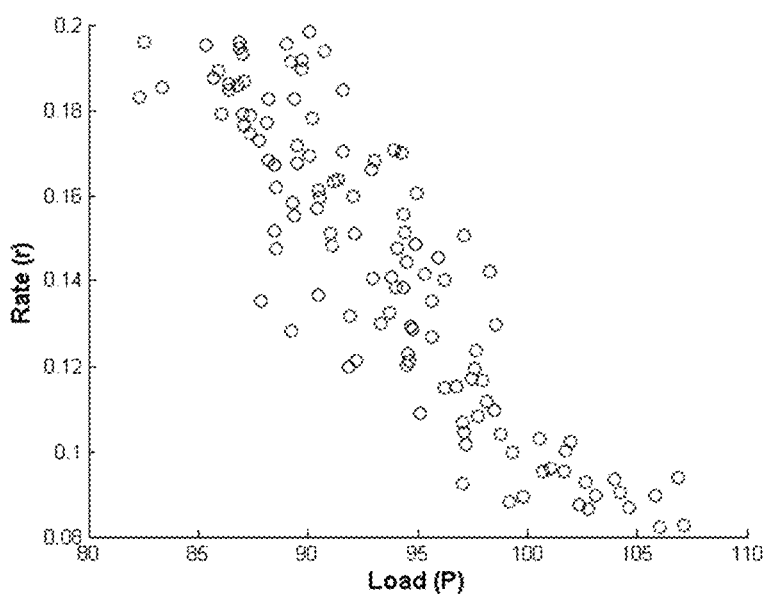
FIG. 11 is a plot showing exemplary response levels with randomization.
Figure 12:
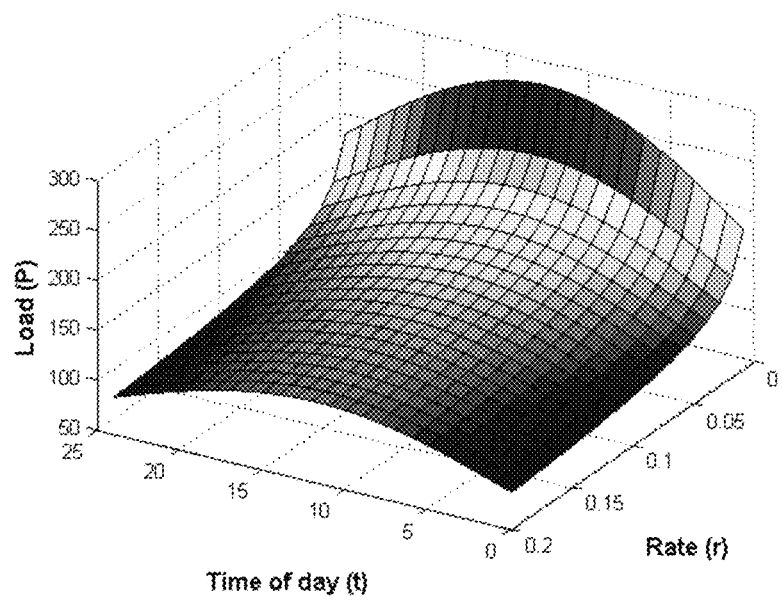
FIG. 12 is a 3-dimensional plot showing an exemplary deterministic price response comparing load with the time of day and rate.
Figure 13:
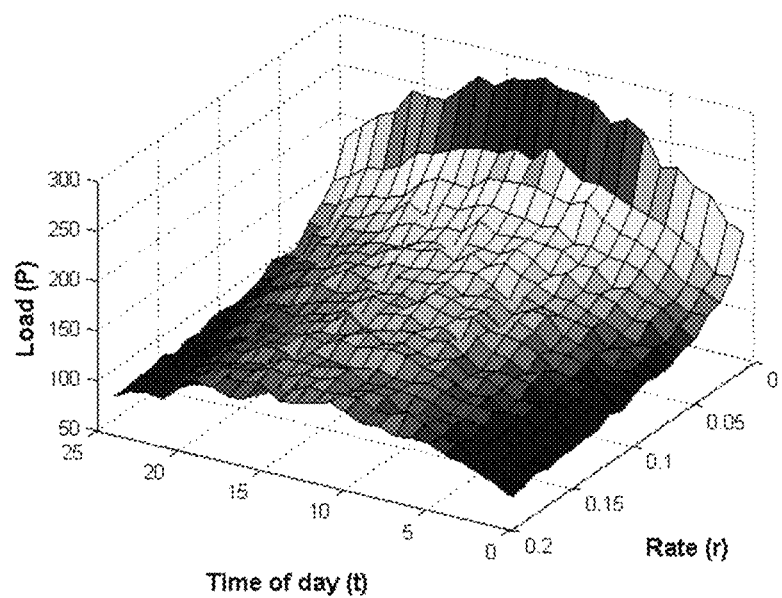
FIG. 13 is a 3-dimensional plot showing an exemplary randomized price response comparing load with the time of day and rate.

FIG. 10 shows the estimated demand curves. FIG. 11 shows the responses for different rates when the customer's response $s_k$=3% for each k. FIGS. 12 and 13 show price response over the course of a day, respectively with no randomization and with $s_k$=3% for each k.

One or more embodiments of the present invention have been described. Nevertheless, it will be understood that various modifications may be made without departing from the spirit and scope of the invention. Accordingly, other embodiments are within the scope of the following claims.

What is claimed is:

1. A customer electrical load curve simulation method that uses historical customer load patterns to generate customer load curves comprising:
   inputting pattern parameters $\hat{\mu}_0$, $\hat{\sigma}_0$, $\hat{\mu}=[\hat{\mu}_{0+\Delta t}, \ldots, \hat{\mu}_{24}]$ and $\hat{\sigma}=[\hat{\sigma}_{0+\Delta t}, \ldots, \hat{\sigma}_{24}]$, and simulation parameters $P_{\bar{t}_{start}}$, $n_{sim}$ and $[\bar{t}_{start}, \bar{t}_{end}, \Delta \bar{t}]$ wherein $P_{\bar{t}_{start}}$ is the desired starting load level, $n_{sim}$ is the number of simulated load curves that will be generated, $\bar{t}_{start}$ is the desired starting time of the simulation, $\bar{t}_{end}$ is the desired ending time of the simulation and $\Delta \bar{t}$ is the desired time resolution for the simulation, $\hat{\mu}_0$ and $\hat{\sigma}_0$ are the mean and standard deviation of the starting load level of estimated pattern parameters and $\hat{\mu}$ and $\hat{\sigma}$ are vectors which represent the mean and the standard deviation of the load changes between each load sample $\Delta t$, wherein the pattern parameters $\hat{\mu}_0$, $\hat{\sigma}_0$, $\hat{\mu}=[\hat{\mu}_{0+\Delta t}, \ldots, \hat{\mu}_{24}]$ and $\hat{\sigma}=[\hat{\sigma}_{0+\Delta t}, \ldots, \hat{\sigma}_{24}]$ are calculated from historical electrical load data comprising:
   inputting historical electrical load data $\hat{P}_{ti}$ for each time interval $t \in [0,24]$ and observation $i=1, 2, \ldots, N$;
   calculating the mean $\hat{\mu}_0 = \sum_{i=1}^{N} \hat{P}_{0i}/N$ and the standard deviation $\hat{\sigma}_0 = \sqrt{\sum_{i=1}^{N}(\hat{P}_{0i}-\hat{\mu}_0)^2/(N-1)}$ of starting load level $P_0$; and
   calculating the mean $\hat{\mu}_t = \sum_{i=1}^{N} \Delta \hat{P}_{ti}/N$ and the standard deviation $\hat{\sigma}_t = \sqrt{\sum_{i=1}^{N}(\Delta \hat{P}_{ti}-\hat{\mu}_t)^2/(N-1)}$ of the load change $\Delta P_t$ between time $t-\Delta t$ and t;
   if $P_{\bar{t}_{start}} \neq \mu_{\bar{t}_{start}}$, where $\mu_{\bar{t}_{start}}$ is a desired starting time, determining a scaling parameter $\alpha = P_{\bar{t}_{start}}/\mu_{\bar{t}_{start}}$ and multiplying the mean $\mu$ and variance $\hat{\sigma}$ parameters by the scaling parameter $\alpha$;
   generating random numbers that are distributed according to a standard normal distribution, wherein generating $u_{\bar{t}}$ that are uniformly distributed in [0,1] and converting the $u_{\bar{t}}$ to standard normal random numbers by inverse transform sampling $\Phi^{-1}(u)$);
   calculating the load $P_{j,\bar{t}} = P_{j,\bar{t}-\Delta \bar{t}} + \mu_{\bar{t}} + \Phi^{-1}(u_{\bar{t}})\sigma_{\bar{t}}$ for each simulation replication $j \in \{1, \ldots, n_{sim}\}$ and time point $\bar{t} \in [\bar{t}_{start}, \bar{t}_{end}]$;
   calculating a load matrix $$P = [P_{j,\bar{t}}] \in R^{n_{sim} \times \left(\frac{\bar{t}_{end}-\bar{t}_{start}}{\Delta \bar{t}}+1\right)}$$

as output; and
simulating the customer electrical load curve using the load matrix.

2. The method according to claim 1 wherein if the pattern parameter's time frame or time resolution are different from the desired time frame or time resolution, converting the pattern parameter's time frame or time resolution to the desired time frame or time resolution comprising:
   calculating cumulative means $\sum_{i=0}^{\bar{t}} \hat{\mu}_i$ and variances $\sum_{i=0}^{\bar{t}} \hat{\sigma}_i^2$ for each time point $\bar{t}$ in the pattern parameter data;
   interpolating the cumulative means $\sum_{i=0}^{\bar{t}} \hat{\mu}_i$ and variances $\sum_{i=0}^{\bar{t}} \hat{\sigma}_i^2$ of the pattern parameter data obtaining cumulative means $\mu$ and cumulative standard deviation $\sigma$ vectors for each discrete time point $\bar{t}$ value in the simulation interval $\bar{t} \in [\bar{t}_{start}, \bar{t}_{end}]$ with increments of $\Delta \bar{t}$; and
   calculating first differences to obtain the means $\mu_{\bar{t}} = \bar{\mu}_{\bar{t}} - \bar{\mu}_{\bar{t}-\Delta \bar{t}}$ and standard deviations $\sigma_{\bar{t}} = \sqrt{\bar{\sigma}_{\bar{t}}^2 - \bar{\sigma}_{\bar{t}-\Delta \bar{t}}^2}$ for each time increment $\Delta \bar{t}$ starting from $\bar{t} = \bar{t}_{start} + \Delta \bar{t}$.

3. The method according to claim 1 wherein the default time for the desired starting time $\bar{t}_{start}$ is 0.

4. The method according to claim 1 wherein the default time for the desired ending time $\bar{t}_{end}$ is 24.

5. The method according to claim 1 wherein the default time for the desired time resolution $\Delta \bar{t}$ is 15 minutes.

* * * * *